(12) United States Patent
Ode

(10) Patent No.: US 11,508,906 B2
(45) Date of Patent: Nov. 22, 2022

(54) SEMICONDUCTOR MEMORY DEVICE

(71) Applicant: KIOXIA CORPORATION, Tokyo (JP)

(72) Inventor: Hiroyuki Ode, Yokkaichi Mie (JP)

(73) Assignee: KIOXIA CORPORATION, Tokyo (JP)

(*) Notice: Subject to any disclaimer, the term of this patent is extended or adjusted under 35 U.S.C. 154(b) by 120 days.

(21) Appl. No.: 16/809,915

(22) Filed: Mar. 5, 2020

(65) Prior Publication Data

US 2021/0066586 A1    Mar. 4, 2021

(30) Foreign Application Priority Data

Sep. 4, 2019    (JP) .............................. JP2019-161102

(51) Int. Cl.
*H01L 27/24* (2006.01)
*H01L 45/00* (2006.01)
*G11C 13/00* (2006.01)

(52) U.S. Cl.
CPC ........ *H01L 45/128* (2013.01); *G11C 13/0069* (2013.01); *H01L 27/2472* (2013.01); *H01L 45/06* (2013.01)

(58) Field of Classification Search
CPC ... H01L 45/128; H01L 27/2472; H01L 45/06; H01L 27/2409; H01L 27/2481; H01L 45/1233; H01L 45/144; H01L 27/2436; G11C 13/0069; G11C 2013/008; G11C 13/0004; G11C 13/003; G11C 2213/71; G11C 2213/72

See application file for complete search history.

(56) References Cited

U.S. PATENT DOCUMENTS

| | | | |
|---|---|---|---|
| 6,707,087 B2 * | 3/2004 | Fricke | G11C 13/0004 257/288 |
| 7,705,343 B2 | 4/2010 | Suh | |
| 8,648,326 B2 * | 2/2014 | Breitwisch | H01L 45/1233 257/4 |
| 10,147,876 B1 * | 12/2018 | Huang | H01L 45/06 |

(Continued)

FOREIGN PATENT DOCUMENTS

| | | |
|---|---|---|
| JP | 2004-031953 A | 1/2004 |
| JP | 2006-339642 A | 12/2006 |

(Continued)

*Primary Examiner* — S M Sohel Imtiaz
(74) *Attorney, Agent, or Firm* — Foley & Lardner LLP

(57) ABSTRACT

According to one embodiment, a semiconductor memory device includes: a first and a second wirings; a third wiring disposed between them; a first phase change layer disposed between the first and the third wirings; a first conducting layer disposed on a first wiring side surface of the first phase change layer; a second conducting layer disposed on a third wiring side surface of the first phase change layer; a second phase change layer disposed between the third and the second wirings; a third conducting layer disposed on a third wiring side surface of the second phase change layer; and a fourth conducting layer disposed on a second wiring side surface of the second phase change layer. The first and the fourth conducting layers have coefficients of thermal conductivity larger or smaller than the coefficients of thermal conductivity of the second and the third conducting layers.

18 Claims, 9 Drawing Sheets

(56) References Cited

U.S. PATENT DOCUMENTS

| | | | | |
|---|---|---|---|---|
| 2008/0137400 | A1* | 6/2008 | Chen | G11C 8/10 |
| | | | | 365/163 |
| 2008/0149910 | A1* | 6/2008 | An | H01L 45/1675 |
| | | | | 257/4 |
| 2010/0051896 | A1* | 3/2010 | Park | H01L 27/24 |
| | | | | 257/4 |
| 2011/0215288 | A1* | 9/2011 | Matsui | H01L 45/06 |
| | | | | 257/2 |
| 2013/0223133 | A1* | 8/2013 | Azuma | G11C 13/0023 |
| | | | | 365/148 |
| 2015/0043267 | A1* | 2/2015 | Ryoo | G11C 13/0007 |
| | | | | 365/148 |
| 2019/0123103 | A1* | 4/2019 | Wu | G11C 13/0004 |
| 2021/0378155 | A1* | 12/2021 | Qin | H05K 7/20963 |

FOREIGN PATENT DOCUMENTS

| | | |
|---|---|---|
| JP | 2006-352082 A | 12/2006 |
| JP | 2011-018838 A | 1/2011 |

* cited by examiner

FIG. 6A
FIG. 6B
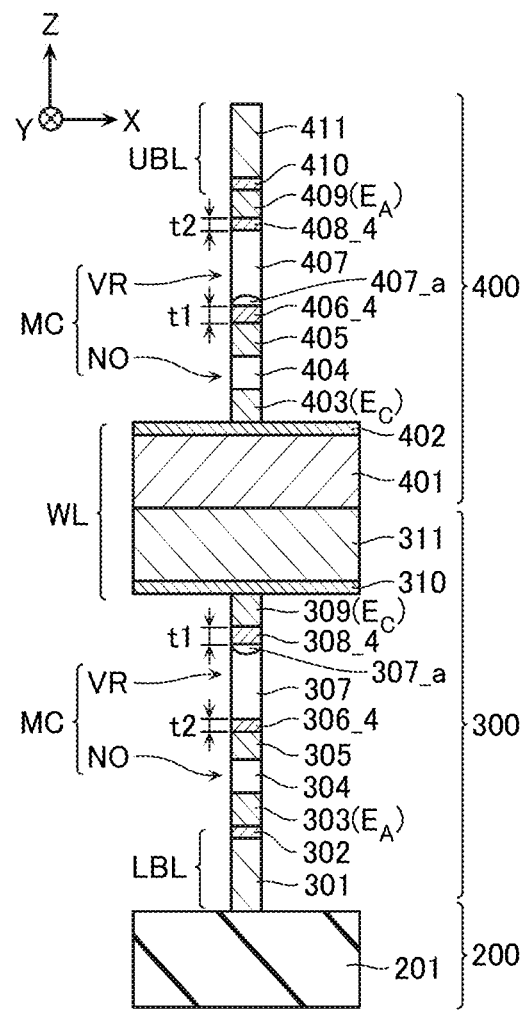
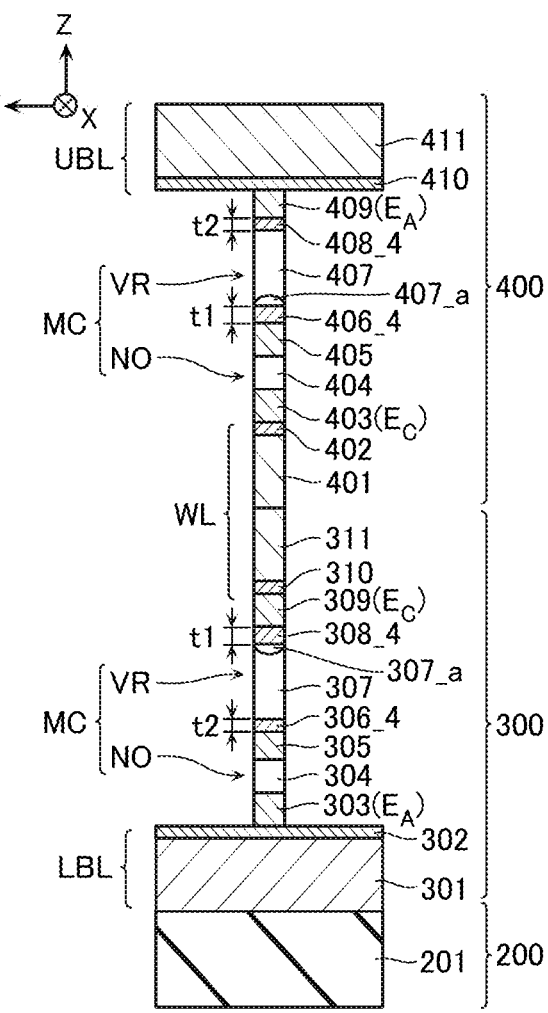

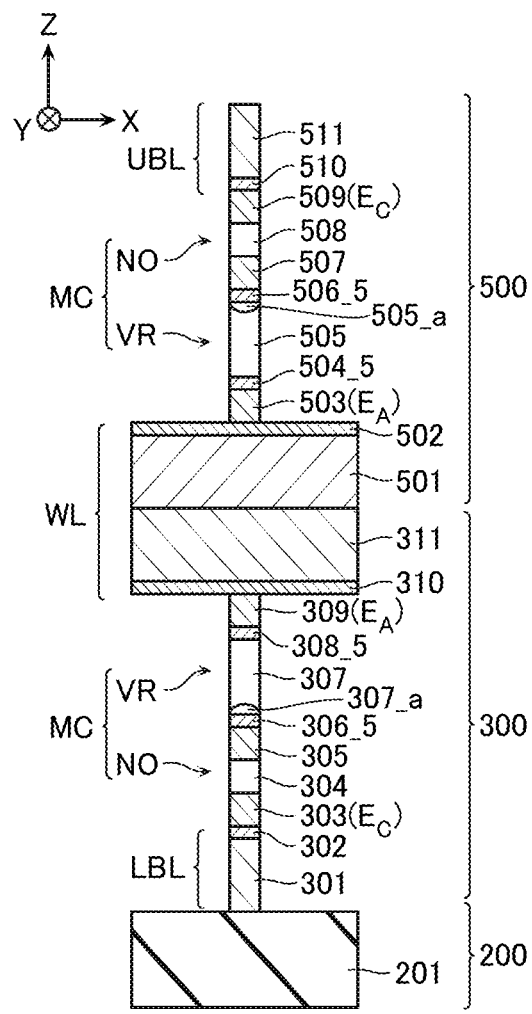
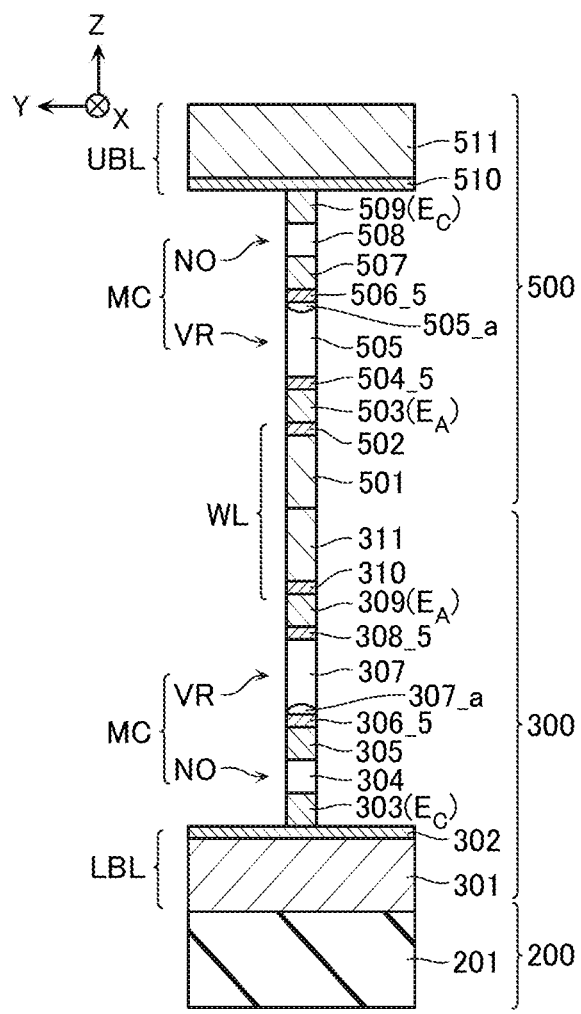

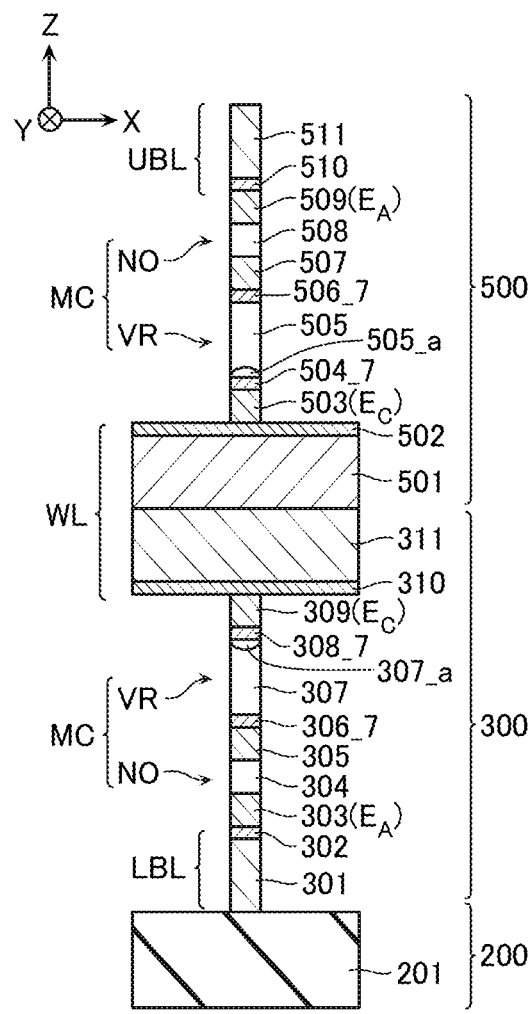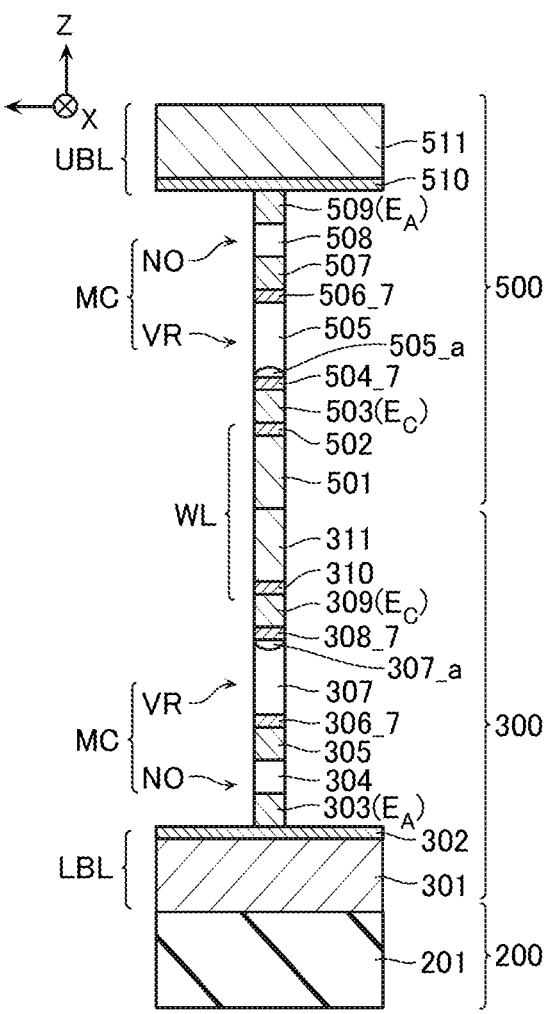

SEMICONDUCTOR MEMORY DEVICE

CROSS-REFERENCE TO RELATED APPLICATIONS

This application is based upon and claims the benefit of Japanese Patent Application No. 2019-161102, filed on Sep. 4, 2019, the entire contents of which are incorporated herein by reference.

BACKGROUND

Field

Embodiments described herein relate generally to a semiconductor memory device.

Description of the Related Art

There has been known a semiconductor memory device that includes first wirings and second wirings arranged in a first direction and extending in a second direction intersecting with the first direction, third wirings disposed between the first wirings and the second wirings and extending in a third direction intersecting with the first direction and the second direction, first phase change layers disposed between the first wirings and the third wirings, and second phase change layers disposed between the third wirings and the second wirings. The first phase change layer and the second phase change layer contain, for example, germanium (Ge), antimony (Sb), and tellurium (Te).

BRIEF DESCRIPTION OF THE DRAWINGS

FIGS. 6A and 6B are schematic cross-sectional views illustrating a configuration of a part of a semiconductor memory device according to a fourth embodiment;

FIGS. 7A and 7B are schematic cross-sectional views illustrating a configuration of a part of a semiconductor memory device according to a fifth embodiment;

FIGS. 9A and 9B are schematic cross-sectional views illustrating a configuration of a part of a semiconductor memory device according to a seventh embodiment.

DETAILED DESCRIPTION

Figure 1:
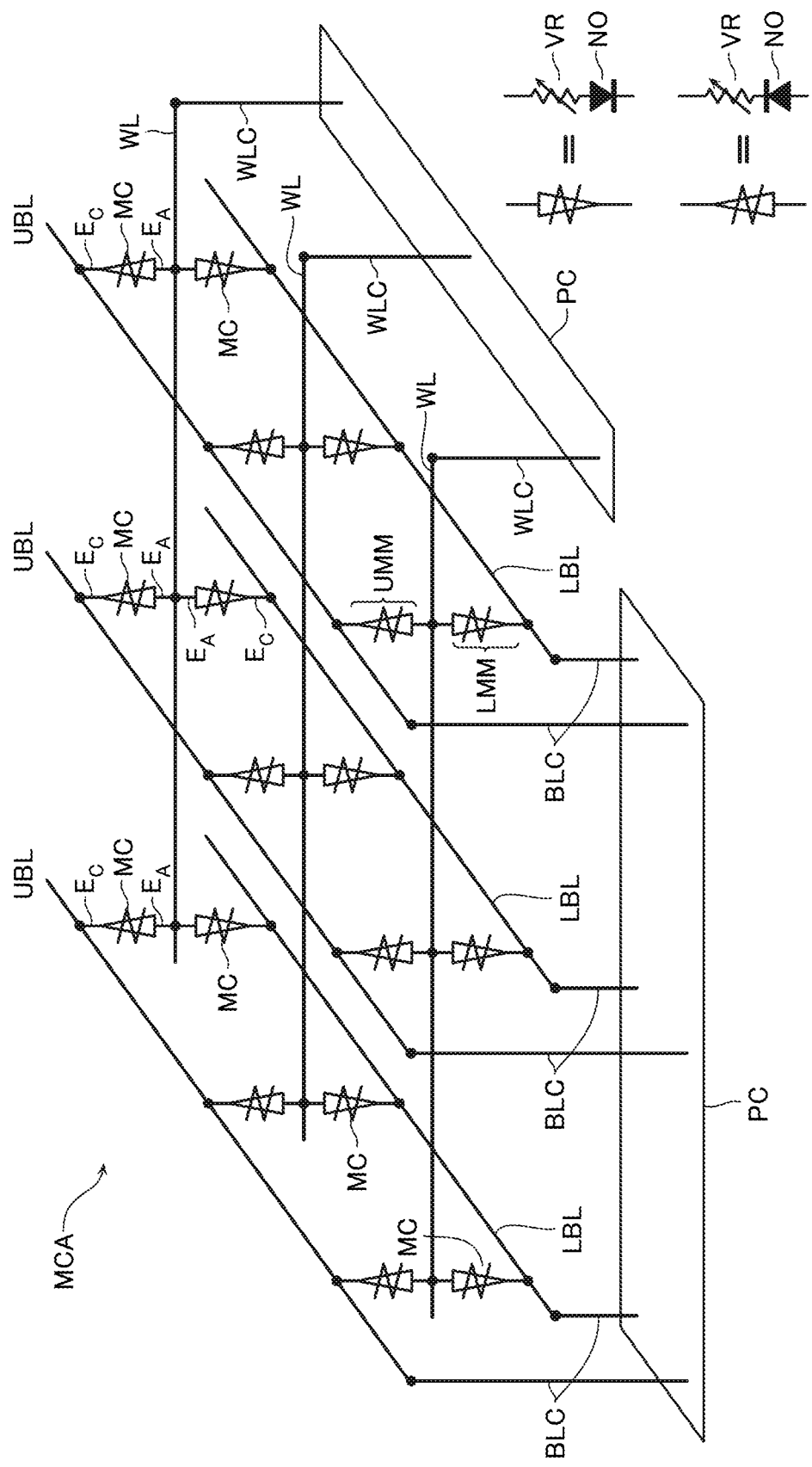
FIG. 1 is a schematic circuit diagram illustrating a configuration of a part of a semiconductor memory device according to a first embodiment.

A semiconductor memory device according to one embodiment includes a first wiring, a second wiring, a third wiring, a first phase change layer, a first conducting layer, a second conducting layer, a second phase change layer, a third conducting layer, and a fourth conducting layer. The first wiring and the second wiring are arranged in a first direction and extend in a second direction intersecting with the first direction. The third wiring is disposed between the first wiring and the second wiring and extends in a third direction. The third direction intersects with the first direction and the second direction. The first phase change layer is disposed between the first wiring and the third wiring. The first conducting layer is disposed on a surface on a first wiring side of the first phase change layer. The second conducting layer is disposed on a surface on a third wiring side of the first phase change layer. The second phase change layer is disposed between the third wiring and the second wiring. The third conducting layer is disposed on a surface on the third wiring side of the second phase change layer. The fourth conducting layer is disposed on a surface on a second wiring side of the second phase change layer. The first conducting layer and the fourth conducting layer have coefficients of thermal conductivity larger than coefficients of thermal conductivity of the second conducting layer and the third conducting layer, or smaller than the coefficients of thermal conductivity of the second conducting layer and the third conducting layer.

A semiconductor memory device according to one embodiment includes a first wiring, a second wiring, a third wiring, a first phase change layer, a first conducting layer, a second conducting layer, a second phase change layer, a third conducting layer, and a fourth conducting layer. The first wiring and the second wiring are arranged in a first direction and extend in a second direction intersecting with the first direction. The third wiring is disposed between the first wiring and the second wiring and extends in a third direction. The third direction intersects with the first direction and the second direction. The first phase change layer is disposed between the first wiring and the third wiring. The first conducting layer is disposed on a surface on a first wiring side of the first phase change layer. The second conducting layer is disposed on a surface on a third wiring side of the first phase change layer. The second phase change layer is disposed between the third wiring and the second wiring. The third conducting layer is disposed on a surface on the third wiring side of the second phase change layer. The fourth conducting layer is disposed on a surface on a second wiring side of the second phase change layer. In the first direction, thicknesses of the first conducting layer and the fourth conducting layer are larger than thicknesses of the second conducting layer and the third conducting layer, or smaller than the thicknesses of the second conducting layer and the third conducting layer.

A semiconductor memory device according to one embodiment includes a first wiring, a second wiring, a third wiring, a first phase change layer, a first conducting layer, a second conducting layer, a second phase change layer, a third conducting layer, and a fourth conducting layer. The first wiring and the second wiring are arranged in a first direction and extend in a second direction intersecting with the first direction. The third wiring is disposed between the first wiring and the second wiring and extends in a third direction. The third direction intersects with the first direction and the second direction. The first phase change layer is disposed between the first wiring and the third wiring. The first conducting layer is disposed on a surface on a first wiring side of the first phase change layer. The second conducting layer is disposed on a surface on a third wiring side of the first phase change layer. The second phase change layer is disposed between the third wiring and the second wiring. The third conducting layer is disposed on a surface on the third wiring side of the second phase change layer. The fourth conducting layer is disposed on a surface on a second wiring side of the second phase change layer. When thicknesses in the first direction of the first conducting layer and the fourth conducting layer are denoted as t1, thicknesses in the first direction of the second conducting layer and the third conducting layer are denoted as t2, coefficients of thermal conductivity of the first conducting layer and the fourth conducting layer are denoted as $\lambda 1$, and coefficients of thermal conductivity of the second conducting layer and the third conducting layer are denoted as $\lambda 2$, $((1/\lambda 1) \times t1)/((1/\lambda 2) \times t2)$ is larger than 1.7 or smaller than 1/1.7.

Next, semiconductor memory devices according to embodiments will be described in detail with reference to the drawings. The following embodiments are merely examples, and will not be described for the purpose of limiting the present invention.

In this specification, a predetermined direction parallel to a surface of a substrate is referred to as an X direction, a direction parallel to the surface of the substrate and perpendicular to the X direction is referred to as a Y direction, and a direction perpendicular to the surface of the substrate is referred to as a Z direction.

In this specification, a direction along a predetermined plane may be referred to as a first direction, a direction along this predetermined plane and intersecting with the first direction may be referred to as a second direction, and a direction intersecting with this predetermined plane may be referred to as a third direction. These first direction, second direction, and third direction may correspond to any of the X direction, the Y direction, and the Z direction or need not to correspond to these directions.

Expressions such as "above" and "below" in this specification are based on the substrate. For example, a direction away from the substrate along the Z direction is referred to as above and a direction approaching the substrate along the Z direction is referred to as below. A lower surface and a lower end of a certain configuration mean a surface and an end portion on the substrate side of this configuration. A top surface and an upper end of a certain configuration mean a surface and an end portion on a side opposite to the substrate of this configuration. A surface intersecting with the X direction or the Y direction is referred to as a side surface or the like.

With reference to the drawings, circuit configurations of the semiconductor memory devices according to the embodiments will be described below. The following drawings are schematic, and for convenience of explanation, a part of a configuration is sometimes omitted. Common reference numerals may be given to parts common to the plurality of embodiments to omit the descriptions.

First Embodiment

[Schematic Configuration]

Figure 2:
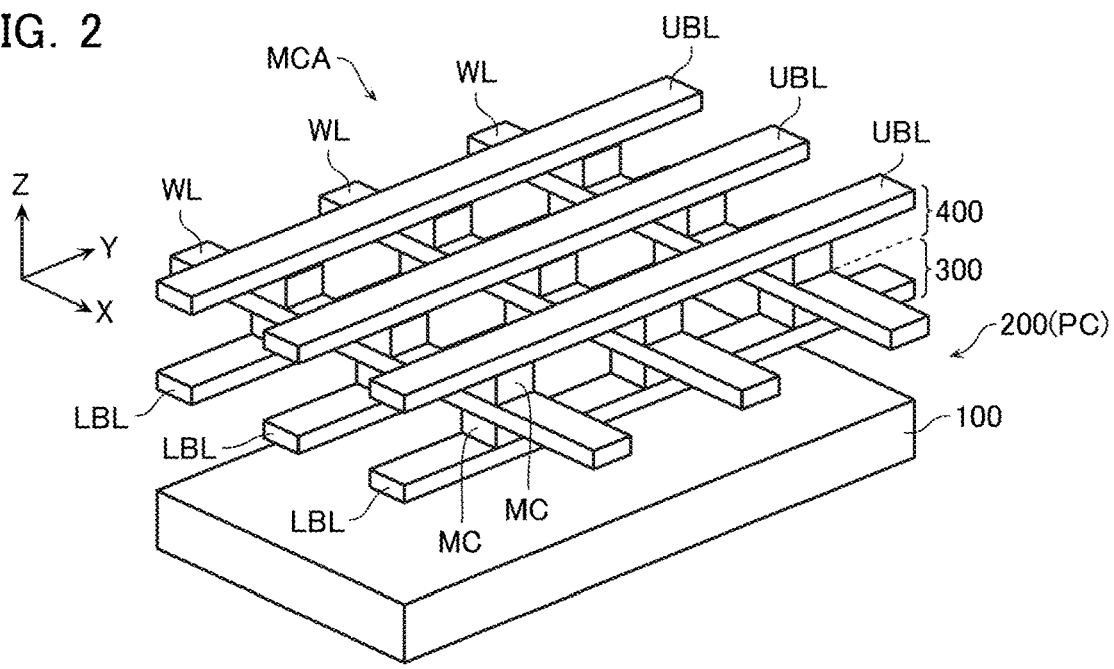
FIG. 2 is a schematic perspective view illustrating a configuration of a part of the semiconductor memory device.

FIG. 1 is a schematic circuit diagram illustrating a configuration of a part of a semiconductor memory device according to the first embodiment. FIG. 2 is a schematic perspective view illustrating a configuration of a part of the semiconductor memory device.

The semiconductor memory device according to the embodiment includes a memory cell array MCA and a peripheral circuit PC controlling the memory cell array MCA.

For example, as illustrated in FIG. 2, the memory cell array MCA is disposed above a substrate 100. The memory cell array MCA includes a lower memory mat 300 and an upper memory mat 400 arranged in the Z direction. The lower memory mat 300 includes a plurality of lower bit lines LBL arranged in the X direction and extending in the Y direction, a plurality of word lines WL arranged in the Y direction and extending in the X direction, and a plurality of memory cells MC arranged in the X direction and the Y direction corresponding to the lower bit lines LBL and the word lines WL. The upper memory mat 400 includes a plurality of upper bit lines UBL arranged in the X direction and extending in the Y direction, the plurality of word lines WL arranged in the Y direction and extending in the X direction, and the plurality of memory cells MC arranged in the X direction and the Y direction corresponding to the upper bit lines UBL and the word lines WL. In the example illustrated, the lower memory mat 300 and the upper memory mat 400 share the word lines WL. In the example of FIG. 1, a cathode $E_C$ of the memory cell MC is connected to the lower bit line LBL or the upper bit line UBL. Additionally, an anode $E_A$ of the memory cell MC is connected to the word line WL. The memory cell MC includes a variable resistance element VR and a nonlinear element NO.

For example, as illustrated in FIG. 2, the peripheral circuit PC is disposed in a circuit layer 200, which is disposed between the substrate 100 and the lower memory mat 300. The peripheral circuit PC includes a plurality of field effect transistors (not illustrated) formed on a top surface of the substrate 100 and a plurality of wirings (not illustrated) connected to them. In the example of FIG. 1, the peripheral circuit PC is connected to the lower bit lines LBL and the upper bit lines UBL via bit line contacts BLC. The peripheral circuit PC is connected to the word lines WL via word line contacts WLC.

The peripheral circuit PC includes, for example, a data register that holds user data read from the memory cells MC and user data to be written to the memory cells MC, an address register that holds address data of the selected memory cell MC as a target for a read operation or a write operation, and a command register that holds command data. The peripheral circuit PC includes, for example, a step down circuit that steps down, for example, a power supply voltage supplied to, for example, a pad electrode and outputs the power supply voltage to a voltage supply line, a voltage transfer circuit that electrically conducts the lower bit line LBL and the upper bit line UBL and the word line WL corresponding to the address data and the corresponding voltage supply line, a sense amplifier circuit that outputs data of 0 or 1 according to a voltage or a current of the lower bit line LBL and the upper bit line UBL and outputs the data to the data register. Additionally, the peripheral circuit PC includes, for example, a sequencer that controls the circuits.

Next, with reference to FIGS. 3A and 3B, the configuration of the semiconductor memory device according to the embodiment will be described in more detail.

Figure 3A:
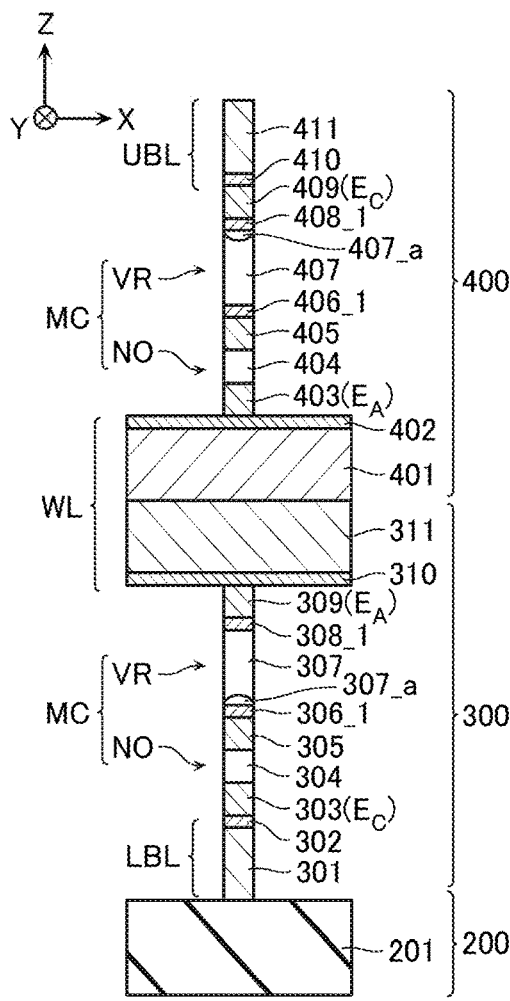
FIGS. 3A and 3B are schematic cross-sectional views illustrating a configuration of a part of the semiconductor memory device.

FIG. 3A is a schematic cross-sectional view when a part of a structure illustrated in FIG. 2 is viewed from the Y direction. FIG. 3B is a schematic cross-sectional view when a part of the structure illustrated in FIG. 2 is viewed from the X direction.

The circuit layer 200 includes an insulating layer 201. The insulating layer 201 contains, for example, silicon oxide ($SiO_2$).

The lower memory mat 300 includes a conducting layer 301, a barrier conducting layer 302, an electrode layer 303, a chalcogen layer 304, an electrode layer 305, a barrier conducting layer 306_1, a chalcogen layer 307, a barrier conducting layer 308_1, an electrode layer 309, a barrier conducting layer 310, and a conducting layer 311.

The conducting layer 301 is disposed on a top surface of the insulating layer 201. The conducting layer 301 extends in the Y direction and functions as a part of the lower bit line LBL. The conducting layer 301 contains, for example, tungsten (W).

The barrier conducting layer 302 is disposed on a top surface of the conducting layer 301. The barrier conducting layer 302 extends in the Y direction and functions as a part of the lower bit line LBL. The barrier conducting layer 302 contains, for example, tungsten nitride (WN).

The electrode layer 303 is disposed on a top surface of the barrier conducting layer 302. The electrode layer 303 functions as the cathode $E_C$ of the memory cell MC. The electrode layer 303 contains, for example, a carbon nitride (CN).

The chalcogen layer 304 is disposed on a top surface of the electrode layer 303. The chalcogen layer 304 functions as the nonlinear element NO. For example, in a case where a voltage lower than a predetermined threshold is applied to the chalcogen layer 304, the chalcogen layer 304 is in a high resistance state. When the voltage applied to the chalcogen layer 304 reaches the predetermined threshold, the chalcogen layer 304 enters a low resistance state and a current flowing through the chalcogen layer 304 increases by a plurality of digits. When the voltage applied to the chalcogen layer 304 falls below the predetermined voltage for a constant period, the chalcogen layer 304 enters the high resistance state again.

The chalcogen layer 304 contains, for example, at least one or more kinds of chalcogen. The chalcogen layer 304 may contain, for example, a chalcogenide, which is a compound containing a chalcogen. Additionally, the chalcogen layer 304 may contain at least one kind of element selected from the group consisting of B, Al, Ga, In, C, Si, Ge, Sn, As, P, and Sb.

Note that the chalcogen here means one other than oxygen (O) among elements belonging to the group 16 of the periodic table. The chalcogen contains, for example, sulfur (S), selenium (Se), and tellurium (Te).

The electrode layer 305 is disposed on a top surface of the chalcogen layer 304. The electrode layer 305 functions as an electrode connected to the variable resistance element VR and the nonlinear element NO. The electrode layer 305 contains, for example, carbon (C).

The barrier conducting layer 306_1 is disposed on a top surface of the electrode layer 305. The barrier conducting layer 306_1 functions as a heat shielding material that causes heat generated in the chalcogen layer 307 to be less likely to escape. The barrier conducting layer 306_1 contains, for example, tungsten nitride (WN).

The chalcogen layer 307 is disposed on a top surface of the barrier conducting layer 306_1. The chalcogen layer 307 functions as the variable resistance element VR.

The chalcogen layer 307 contains, for example, at least one or more kinds of chalcogen. The chalcogen layer 307 may contain, for example, a chalcogenide, which is a compound containing a chalcogen. The chalcogen layer 307 may be, for example, GeSbTe, GeCuTe, GeTe, SbTe, and SiTe. The chalcogen layer 307 may contain at least one kind of element selected from germanium (Ge), antimony (Sb), and tellurium (Te).

The chalcogen layer 307 includes a phase change region 307_a. The phase change region 307_a is disposed in an area on the cathode $E_C$ side inside the chalcogen layer 307 (an area on the lower bit line LBL side) and in contact with the barrier conducting layer 306_1. The phase change region 307_a functions as a memory portion that changes its phase to an amorphous state or a crystalline state by heat.

The barrier conducting layer 308_1 is disposed on a top surface of the chalcogen layer 307. The barrier conducting layer 308_1 functions as a heat conducting body that causes the heat generated in the chalcogen layer 307 to be likely to escape. The barrier conducting layer 308_1 contains, for example, a material, such as tungsten (W), having a coefficient of thermal conductivity higher than that of a material contained in the barrier conducting layer 306_1.

The electrode layer 309 is disposed on a top surface of the barrier conducting layer 308. The electrode layer 309 functions as the anode $E_A$ of the memory cell MC. The electrode layer 309 contains, for example, carbon (C).

The barrier conducting layer 310 is disposed on a top surface of the electrode layer 309. The barrier conducting layer 310 extends in the X direction and functions as a part of the word line WL. The barrier conducting layer 310 contains, for example, tungsten nitride (WN).

The conducting layer 311 is disposed on a top surface of the barrier conducting layer 310. The conducting layer 311 extends in the X direction and functions as a part of the word line WL. The conducting layer 311 contains, for example, tungsten (W).

The upper memory mat 400 includes a conducting layer 401, a barrier conducting layer 402, an electrode layer 403, a chalcogen layer 404, an electrode layer 405, a barrier conducting layer 406_1, a chalcogen layer 407, a barrier conducting layer 408_1, an electrode layer 409, a barrier conducting layer 410, and a conducting layer 411.

The conducting layer 401 is disposed on a top surface of the conducting layer 311. The conducting layer 401 extends in the X direction and functions as a part of the word line WL. The conducting layer 401 contains, for example, tungsten (W).

The barrier conducting layer 402 is disposed on a top surface of the conducting layer 401. The barrier conducting layer 402 extends in the X direction and functions as a part of the word line WL. The barrier conducting layer 402 contains, for example, tungsten nitride (WN).

The electrode layer 403 is disposed on a top surface of the barrier conducting layer 402. The electrode layer 403 functions as the anode $E_A$ of the memory cell MC. The electrode layer 403 contains, for example, carbon nitride (CN).

The chalcogen layer 404 is disposed on a top surface of the electrode layer 403. Similarly to the chalcogen layer 304, the chalcogen layer 404 functions as the nonlinear element NO. The chalcogen layer 404 contains, for example, a material similar to that of the chalcogen layer 304.

The electrode layer 405 is disposed on a top surface of the chalcogen layer 404. The electrode layer 405 functions as an electrode connected to the variable resistance element VR and the nonlinear element NO. The electrode layer 405 contains, for example, carbon (C).

The barrier conducting layer 406_1 is disposed on a top surface of the electrode layer 405. The barrier conducting layer 406_1 functions as a heat conducting body that causes the heat generated in the chalcogen layer 407 to be likely to escape. The barrier conducting layer 406_1 contains, for example, tungsten (W).

The chalcogen layer 407 is disposed on a top surface of the barrier conducting layer 406_1. Similarly to the chalcogen layer 307, the chalcogen layer 407 functions as the variable resistance element VR. The chalcogen layer 407 contains, for example, a material similar to that of the chalcogen layer 307.

The chalcogen layer 407 includes a phase change region 407_a. The phase change region 407_a is disposed in an area on the cathode $E_C$ side inside the chalcogen layer 407 (an area on the upper bit line UBL side) and in contact with the barrier conducting layer 408_1. The phase change region 407_a functions as a memory portion that changes its phase to an amorphous state or a crystalline state by heat.

The barrier conducting layer 408_1 is disposed on a top surface of the chalcogen layer 407. The barrier conducting layer 408_1 functions as a heat shielding material that causes the heat generated in the chalcogen layer 407 to be less likely to escape. The barrier conducting layer 408_1 contains, for example, a material, such as tungsten nitride (WN), having a coefficient of thermal conductivity lower than that of a material contained in the barrier conducting layer 406_1.

The electrode layer 409 is disposed on a top surface of the barrier conducting layer 408_1. The electrode layer 409 functions as the cathode $E_C$ of the memory cell MC. The electrode layer 409 contains, for example, carbon (C).

The barrier conducting layer 410 is disposed on a top surface of the electrode layer 409. The barrier conducting layer 410 extends in the Y direction and functions as a part of the upper bit line UBL. The barrier conducting layer 410 contains, for example, tungsten nitride (WN).

The conducting layer 411 is disposed on a top surface of the barrier conducting layer 410. The conducting layer 411 extends in the Y direction and functions as a part of the upper bit line UBL. The conducting layer 411 contains, for example, tungsten (W).

[Write Operation]

Next, the write operation of the memory cell MC according to the embodiment will be described. The write operation of the memory cell MC according to the embodiment includes a reset operation and a set operation. The reset operation is an operation that causes the memory cell MC to transition from the low resistance state to the high resistance state. The set operation is an operation that causes the memory cell MC to transition from the high resistance state to the low resistance state.

Figure 3B:
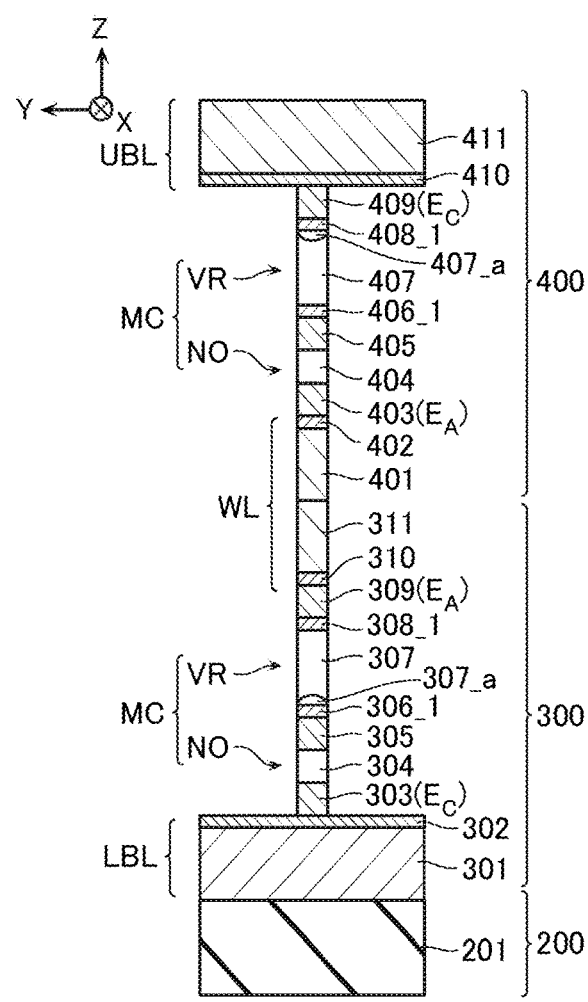

When the reset operation is performed on the memory cell MC included in the lower memory mat 300 illustrated in FIGS. 3A and 3B, the phase change region 307_a included in the chalcogen layer 307 transitions from the crystalline state to the amorphous state.

In the reset operation, for example, a voltage of the anode $E_A$ relative to a voltage of the cathode $E_C$ of the memory cell MC (hereinafter referred to as "cell voltage") is adjusted to a reset voltage. This flows a current (hereinafter referred to as "reset current") to the memory cell MC and Joule heat is supplied to the chalcogen layer 307. The Joule heat at this time has a magnitude of a degree where the phase change region 307_a melts. Subsequently, the cell voltage is adjusted to 0 V. Thus, the Joule heat is not supplied to the chalcogen layer 307, and a melted part of the phase change region 307_a is rapidly cooled to be solidified. During this period, a period required for crystallization is not given to the phase change region 307_a. Therefore, the phase change region 307_a transitions from the amorphous state (reset state: high resistance state).

Additionally, when the set operation is performed on the memory cell MC, the phase change region 307_a, which is included in the chalcogen layer 307, transitions from the amorphous state to the crystalline state.

In the set operation, for example, the cell voltage is adjusted to be a set voltage smaller than the reset voltage and holds the set voltage for a certain period of time. Thus, a current (hereinafter referred to as "set current") flows to the memory cell MC and the Joule heat is supplied to the chalcogen layer 307. The Joule heat at this time has a magnitude sufficient for the phase change region 307_a to crystallize but does not cause melting. Subsequently, the cell voltage is set to 0 V. Thus, the phase change region 307_a transitions from the crystalline state (set state: low resistance state).

The memory cell MC included in the upper memory mat 400 is also controllable by the similar method.

Effects

Hereinafter, the effects of the semiconductor memory device according to the embodiment will be described. Note that, in the following description, the case where the write operation is performed on the lower memory mat 300 is exemplified.

For lower power consumption of the semiconductor memory device, it is considered that the reset current and the set current are decreased. To melt or crystallize the phase change region 307_a at a small current further, for example, it is considered that widths in the X direction and the Y direction of the electrode layer 305 connected to the surface on the cathode $E_C$ side of the chalcogen layer 307 is configured to be smaller than widths in the X direction and the Y direction of the chalcogen layer 307.

When the write operation is performed on the semiconductor memory device having the configuration, a current density in the contact surfaces of the chalcogen layer 307 and the electrode layer 305 increases, and the Joule heat can be efficiently generated on the surface on the cathode $E_C$ side of the chalcogen layer 307. Accordingly, the phase change region 307_a can be melted or crystallized at a further small amount of current.

The method allows a decrease in current density in the contact surfaces between the chalcogen layer 307 and the electrode layer 309 and reducing the Joule heat in the surface on the anode $E_A$ side of the chalcogen layer 307. This allows reducing melting in other than the phase change region 307_a in the chalcogen layer 307, thus achieving stable switching.

However, high integration of the memory cell array MCA as described with reference to FIG. 2 has been developing, and the widths in the X direction and the Y direction of the memory cell MC have been decreasing. There may be a case where the decrease in the widths in the X direction and the Y direction of the electrode layer 305 further in the memory cell MC is not easy for sake of convenience of, for example, processing.

Therefore, in the embodiment, the coefficient of thermal conductivity is adjusted such that the coefficient of thermal conductivity of the barrier conducting layer 306_1, which is disposed on the surface on the cathode $E_C$ side of the chalcogen layer 307, becomes larger than the coefficient of thermal conductivity of the barrier conducting layer 308_1, which is disposed on the surface on the anode $E_A$ side of the chalcogen layer 307.

In the configuration, the heat is less likely to escape from the barrier conducting layer 306_1 side, and the heat is likely to escape from the barrier conducting layer 308_1 side. Therefore, a temperature grade in which the surface on the barrier conducting layer 306_1 side of the chalcogen layer 307 has a high temperature can be efficiently generated in the chalcogen layer 307. Therefore, the write operation can be performed at a further small current without adjusting the widths in the X direction and the Y direction of the electrode layer 305. Additionally, the phase change in the part other than the phase change region 307_a is reduced, thereby ensuring a stable switching operation.

[Configurations of Barrier Conducting Layers]

The coefficients of thermal conductivity of the barrier conducting layers 306_1, 308_1, 406_1, and 408_1 may be adjusted by, for example, selecting the material. Examples of the material constituting the barrier conducting layers 306_1, 308_1, 406_1, and 408_1 include tungsten (W) (170 W/mK), polycrystalline silicon (Si) (150 W/mK), nickel (Ni) (91 W/mK), palladium (Pd) (72 W/mK), platinum (Pt) (70 W/mK), vanadium (V) (31 W/mK), titanium (Ti) (22 W/mK), or titanium nitride (TiN) (19 W/mK), tungsten nitride (WN), or the like produced by adding another element to these materials (the value in the parentheses indicates the coefficient of thermal conductivity of each material).

As described above, the coefficients of thermal conductivity of the barrier conducting layers 308_1 and 406_1 are higher than the coefficients of thermal conductivity of the barrier conducting layers 306_1 and 408_1. Especially, the coefficients of thermal conductivity of the barrier conducting layers 308_1 and 406_1 are preferably 1.7 times or more of the coefficients of thermal conductivity of the barrier conducting layers 306_1 and 408_1. For example, when the materials of the barrier conducting layers 308_1 and 406_1 contain titanium nitride (TiN) (19 W/mK), the materials of the barrier conducting layers 306_1 and 408_1 are preferably, for example, tungsten (W) (170 W/mK), polycrystalline silicon (Si) (150 W/mK), nickel (Ni) (91 W/mK), palladium (Pd) (72 W/mK), and platinum (Pt) (70 W/mK).

For example, the materials of the barrier conducting layers 308_1 and 406_1 may be the above-described materials, such as tungsten (W) and titanium (Ti), and the materials of the barrier conducting layers 306_1 and 408_1 may be materials produced by adding another element to these materials, such as tungsten nitride (WN) and titanium nitride (TiN). In this case, the coefficients of thermal conductivity of the barrier conducting layers 306_1, 308_1, 406_1, and 408_1 may be adjusted by adjusting a concentration of the other element.

Moreover, the barrier conducting layers 308_1 and 406_1 may be laminated films including a plurality of first films and a plurality of second films laminated in the Z direction in alternation. The plurality of first films and the plurality of second films may contain materials different from one another and may have the coefficients of thermal conductivity different from one another. The plurality of first films and the plurality of second films may contain any of the above-described materials. Here, the laminated film formed of the plurality of films decreases the coefficient of thermal conductivity by interface thermal resistance. Therefore, the coefficient of thermal conductivity can be lowered compared with a case where the barrier conducting layers 308_1 and 406_1 are configured as a single-layer film.

Alternatively, all of the barrier conducting layers 308_1, 406_1, 306_1, and 408_1 may be laminated films. In this case, the coefficients of thermal conductivity of the barrier conducting layers 306_1, 308_1, 406_1, and 408_1 may be adjusted by adjusting the number of first films and second films. The method allows making etching rates of the barrier conducting layer 306_1 and the barrier conducting layer 408_1 and etching rates of the barrier conducting layer 308_1 and the barrier conducting layer 406_1 the same comparatively easily.

Note that a composition of each material in the barrier conducting layers 306_1, 308_1, 406_1, and 408_1 can be observed by a method, such as Energy Dispersive X-ray Spectrometry (EDS).

Second Embodiment

Next, a configuration of a semiconductor memory device according to the second embodiment will be described with reference to FIGS. 4A and 4B.

Figure 4A:
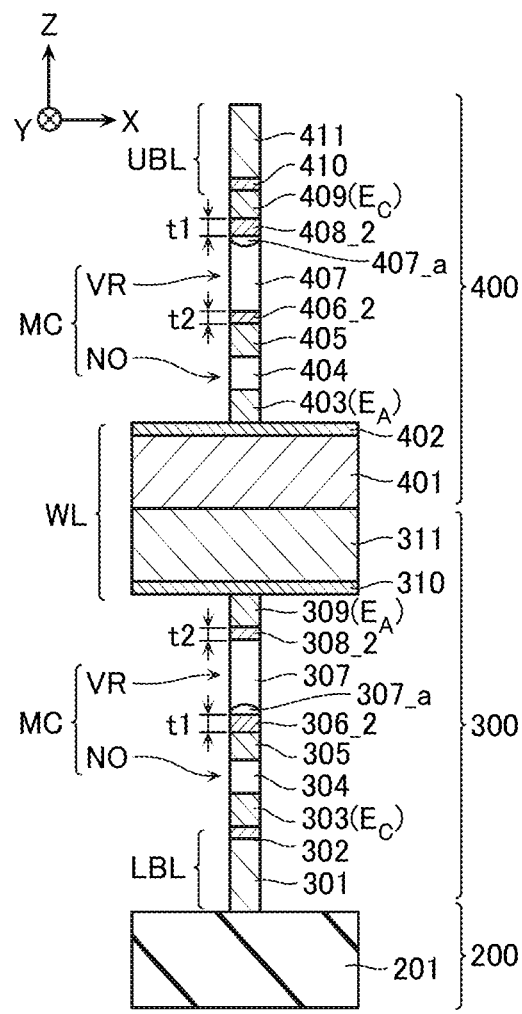
FIGS. 4A and 4B are schematic cross-sectional views illustrating a configuration of a part of a semiconductor memory device according to a second embodiment.

FIG. 4A is a schematic cross-sectional view illustrating a cross-sectional surface corresponding to FIG. 3A. FIG. 4B is a schematic cross-sectional view illustrating a cross-sectional surface corresponding to FIG. 3B.

Figure 4B:
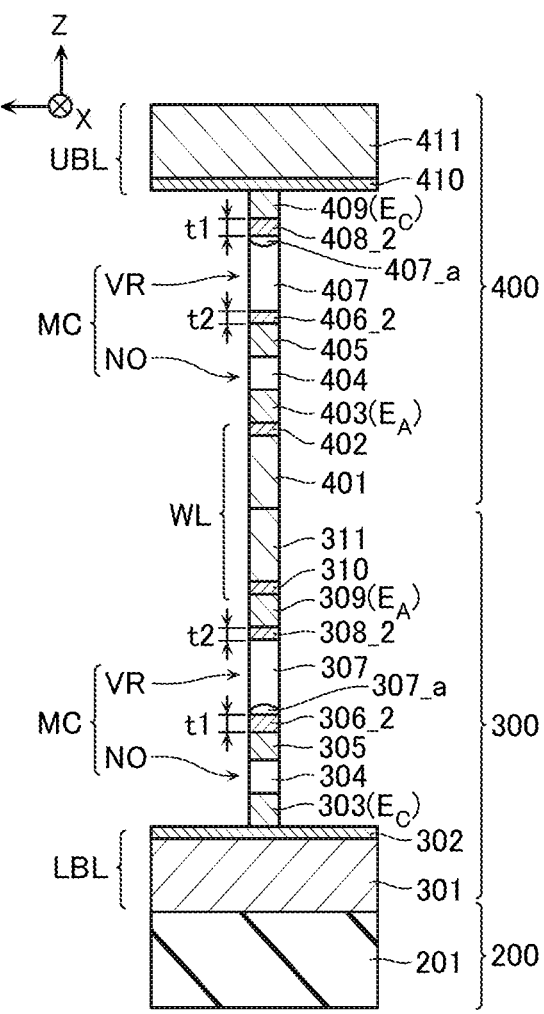

As illustrated in FIGS. 4A and 4B, the memory cell MC according to the embodiment is basically configured similarly to the memory cell MC according to the first embodiment (FIGS. 3A and 3B).

However, in the embodiment, coefficients of thermal conductivity of barrier conducting layers disposed on top surfaces and lower surfaces of the chalcogen layers 307 and 407 are adjusted by adjusting film thicknesses. That is, the memory cell MC according to the embodiment does not include the barrier conducting layers 306_1, 308_1, 406_1, or 408_1 according to the first embodiment but includes barrier conducting layers 306_2, 308_2, 406_2, and 408_2 instead of them. The barrier conducting layers 306_2 and 408_2 have film thicknesses t1 and the barrier conducting layers 308_2 and 406_2 have film thicknesses t2. The film thickness t1 is larger than the film thickness t2.

Here, the heat generated in the chalcogen layer 307 is less likely to escape from the barrier conducting layer 306_2 side having the film thickness t1, and likely to escape from the barrier conducting layer 308_2 side having the film thickness t2. Similarly, the heat generated in the chalcogen layer 407 is less likely to escape from the barrier conducting layer 408_2 side having the film thickness t1, and likely to escape from the barrier conducting layer 306_2 side having the film thickness t2. Therefore, a temperature grade in which the surface on the barrier conducting layer 306_2 side of the chalcogen layer 307 and the surface on the barrier conducting layer 408_2 side of the chalcogen layer 407 have a high temperature can be efficiently generated in the chalcogen layers 307 and 407.

In the embodiment, similarly to the first embodiment, lower power consumption and a stable switching operation can be achieved.

[Configurations of Barrier Conducting Layers]

The barrier conducting layers 306_2, 308_2, 406_2, and 408_2, for example, may contain materials applicable to the barrier conducting layers 306_1, 308_1, 406_1, and 408_1 according to the first embodiment. The materials of the barrier conducting layers 306_2 and 408_2 may be same as or may be different from the materials of the barrier conducting layers 308_2 and 406_2.

When the barrier conducting layers 306_2, 308_2, 406_2, and 408_2 all have the same coefficients of thermal conductivity, the film thickness t1 is preferably thicker than the film thickness t2 by 1.7 times or more.

In a case where the coefficients of thermal conductivity of the barrier conducting layers 306_2 and 408_2 are different from those of the barrier conducting layers 308_2 and 406_2, for example, when the coefficients of thermal conductivity of the barrier conducting layers 306_2 and 408_2 are denoted as λ1 and the coefficients of thermal conductivity of the barrier conducting layers 308_2 and 406_2 are denoted as λ2, ((1/λ1)×t1)/((1/λ2)×t2) is preferably larger than 1.7.

Third Embodiment

Next, a configuration of a semiconductor memory device according to the third embodiment will be described with reference to FIGS. 5A and 5B.

Figure 5A:
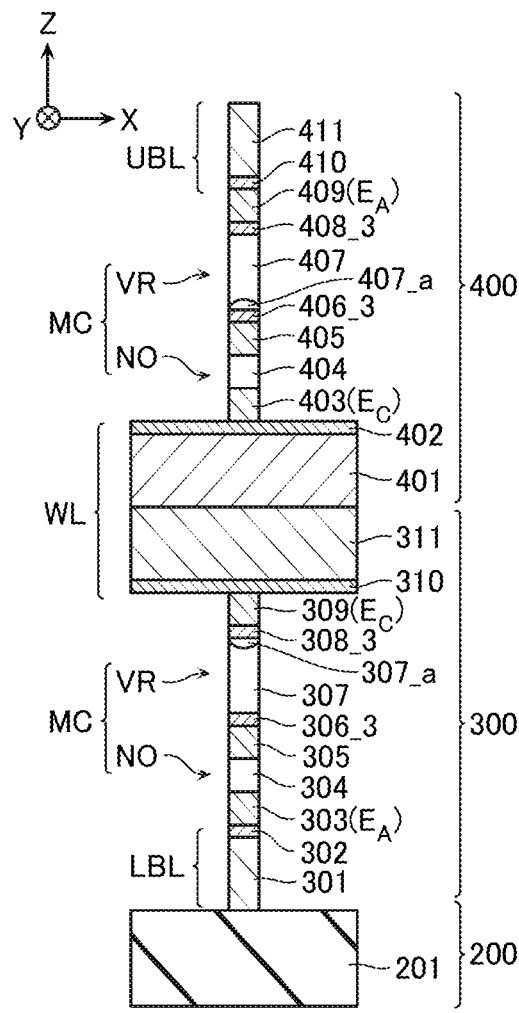
FIGS. 5A and 5B are schematic cross-sectional views illustrating a configuration of a part of a semiconductor memory device according to a third embodiment.

FIG. 5A is a schematic cross-sectional view illustrating a cross-sectional surface corresponding to FIG. 3A. FIG. 5B is a cross-sectional view illustrating a cross-sectional surface corresponding to FIG. 3B.

Figure 5B:
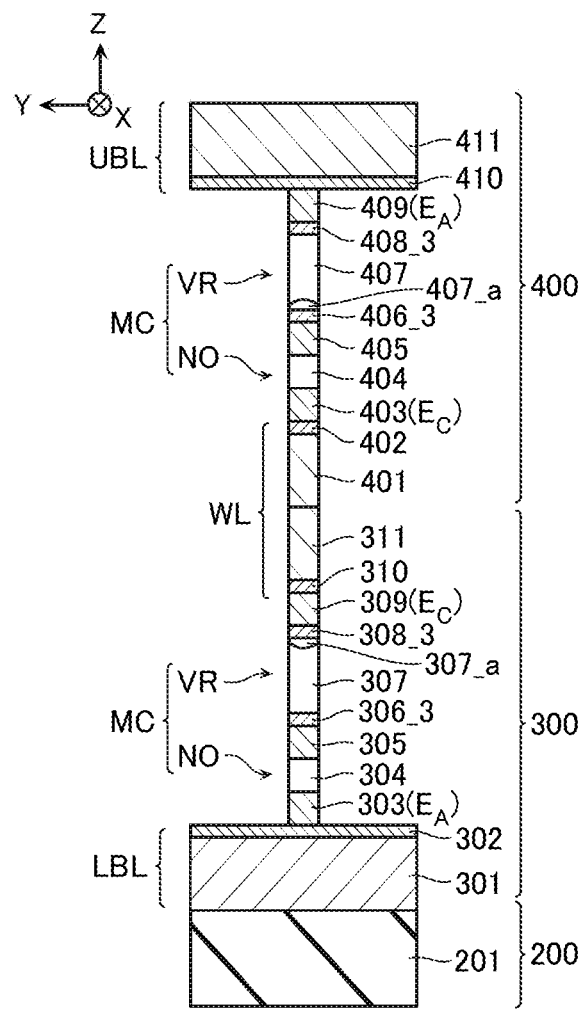

As illustrated in FIGS. 5A and 5B, the memory cell MC according to the embodiment is basically configured similarly to the memory cell MC according to the first embodiment (FIGS. 3A and 3B).

However, in the embodiment, a polarity of the word line WL and polarities of the lower bit line LBL and the upper bit line UBL are switched. That is, the cathode $E_C$ of the memory cell MC is connected to the word line WL, not the lower bit line LBL or the upper bit line UBL. Additionally, the anode $E_A$ of the memory cell MC is connected to the lower bit line LBL or the upper bit line UBL, not the word line WL.

Therefore, in the embodiment, the electrode layers 303 and 409 function as the anodes $E_A$ of the memory cells MC, and the electrode layers 309 and 403 function as the cathodes $E_C$ of the memory cells MC. Additionally, the phase change region 307_a of the chalcogen layer 307 is disposed in the area on the word line WL side inside the chalcogen layer 307, and the phase change region 407_a of the chalcogen layer 407 is disposed in the area on the word line WL side inside the chalcogen layer 407.

The memory cell MC according to the embodiment does not include the barrier conducting layers 306_1, 308_1, 406_1, or 408_1 according to the first embodiment but includes barrier conducting layers 306_3, 308_3, 406_3, and 408_3 instead of them. The barrier conducting layers 308_3 and 406_3 are configured similarly to the barrier conducting layers 306_1 and 408_1. The barrier conducting layers 306_3 and 408_3 are configured similarly to the barrier conducting layers 308_1 and 406_1.

In the embodiment, similarly to the first embodiment, lower power consumption and a stable switching operation can be achieved.

Fourth Embodiment

Next, a configuration of a semiconductor memory device according to the fourth embodiment will be described with reference to FIGS. 6A and 6B.

FIG. 6A is a schematic cross-sectional view illustrating a cross-sectional surface corresponding to FIG. 5A. FIG. 6B is a schematic cross-sectional view illustrating a cross-sectional surface corresponding to FIG. 5A.

As illustrated in FIGS. 6A and 6B, the memory cell MC according to the embodiment is basically configured similarly to the memory cell MC according to the third embodiment (FIGS. 5A and 5B).

However, in the embodiment, similarly to the second embodiment, coefficients of thermal conductivity of barrier conducting layers disposed on top surfaces and lower surfaces of the chalcogen layers 307 and 407 are adjusted by adjusting film thicknesses. That is, the memory cell MC according to the embodiment does not include the barrier conducting layers 306_3, 308_3, 406_3, or 408_3 according to the third embodiment but includes barrier conducting layers 306_4, 308_4, 406_4, and 408_4 instead of them. The barrier conducting layers 308_4 and 406_4 are configured similarly to the barrier conducting layers 306_2 and 408_2 and have the film thicknesses t1. The barrier conducting layers 306_4 and 408_4 are configured similarly to the barrier conducting layers 308_2 and 406_2 and have the film thicknesses t2. As described above, the film thickness t1 is larger than the film thickness t2.

In the embodiment, similarly to the third embodiment, lower power consumption and a stable switching operation can be achieved.

Fifth Embodiment

Next, a configuration of a semiconductor memory device according to the fifth embodiment will be described with reference to FIGS. 7A and 7B.

FIG. 7A is a schematic cross-sectional view illustrating a cross-sectional surface corresponding to FIG. 3A. FIG. 7B is a schematic cross-sectional view illustrating a cross-sectional surface corresponding to FIG. 3B.

As illustrated in FIGS. 7A and 7B, the memory cell MC according to the embodiment is basically configured similarly to the memory cell MC according to the first embodiment (FIGS. 3A and 3B).

However, the memory cell array MCA according to the embodiment does not include the upper memory mat 400 according to the first embodiment but includes an upper memory mat 500 instead of it.

The upper memory mat 500 includes a conducting layer 501, a barrier conducting layer 502, an electrode layer 503, a barrier conducting layer 504_5, a chalcogen layer 505, a barrier conducting layer 506_5, an electrode layer 507, a chalcogen layer 508, an electrode layer 509, a barrier conducting layer 510, and a conducting layer 511.

The conducting layer 501 is disposed on a top surface of the conducting layer 311. The conducting layer 501 extends in the X direction and functions as a part of the word line WL. The conducting layer 501 contains, for example, tungsten (W).

The barrier conducting layer 502 is disposed on a top surface of the conducting layer 501. The barrier conducting layer 502 extends in the X direction and functions as a part of the word line WL. The barrier conducting layer 502 contains, for example, tungsten nitride (WN).

The electrode layer 503 is disposed on a top surface of the barrier conducting layer 502. The electrode layer 503 functions as the anode $E_A$ of the memory cell MC. The electrode layer 503 contains, for example, carbon (C).

The barrier conducting layer 504_5 is disposed on a top surface of the electrode layer 503. The barrier conducting layer 504_5 functions as a heat conducting body that causes the heat generated in the chalcogen layer 505 to be likely to escape. The barrier conducting layer 504_5 contains, for example, tungsten (W).

The chalcogen layer 505 is disposed on a top surface of the barrier conducting layer 504_5. Similarly to the chalcogen layer 307, the chalcogen layer 505 functions as the variable resistance element VR. The chalcogen layer 505 contains, for example, a material similar to that of the chalcogen layer 307.

The chalcogen layer 505 includes a phase change region 505_a. The phase change region 505_a is disposed in an area on the cathode $E_C$ side inside the chalcogen layer 505 (an area on the upper bit line UBL side) and in contact with the barrier conducting layer 506_5. The phase change region 505_a functions as a memory portion that changes its phase to an amorphous state or a crystalline state by heat.

The barrier conducting layer 506_5 is disposed on a top surface of the chalcogen layer 505. The barrier conducting layer 506_5 functions as a heat shielding material that causes the heat generated in the chalcogen layer 505 to be less likely to escape. The barrier conducting layer 506_5 contains, for example, a material, such as tungsten nitride (WN), having a coefficient of thermal conductivity lower than that of a material contained in the barrier conducting layer 504_5.

The electrode layer 507 is disposed on a top surface of the barrier conducting layer 506_5. The electrode layer 507 functions as an electrode connected to the variable resistance element VR and the nonlinear element NO. The electrode layer 507 contains, for example, carbon (C).

The chalcogen layer 508 is disposed on a top surface of the electrode layer 507. Similarly to the chalcogen layer 304, the chalcogen layer 508 functions as the nonlinear element NO. The chalcogen layer 508 contains, for example, a material similar to that of the chalcogen layer 304.

The electrode layer 509 is disposed on a top surface of the chalcogen layer 508. The electrode layer 509 functions as the cathode $E_C$ of the memory cell MC. The electrode layer 509 contains, for example, a carbon nitride (CN).

The barrier conducting layer 510 is disposed on a top surface of the electrode layer 509. The barrier conducting layer 510 extends in the Y direction and functions as a part of the upper bit line UBL. The barrier conducting layer 510 contains, for example, tungsten nitride (WN).

The conducting layer 511 is disposed on a top surface of the barrier conducting layer 510. The conducting layer 511 extends in the Y direction and functions as a part of the upper bit line UBL. The conducting layer 511 contains, for example, tungsten nitride (WN).

In the embodiment, similarly to the first embodiment, lower power consumption and a stable switching operation can be achieved.

In the embodiment, in the lower memory mat 300, the chalcogen layer 304 that functions as the nonlinear element NO is disposed on the cathode $E_C$ side with respect to the chalcogen layer 307 that functions as the variable resistance element VR. Additionally, the coefficient of thermal conductivity of a barrier conducting layer 306_5, which is disposed on the surface on the cathode $E_C$ side of the chalcogen layer 307, is smaller than the coefficient of thermal conductivity of a barrier conducting layer 308_5, which is disposed on the surface on the anode $E_A$ side of the chalcogen layer 307. Similarly, in the upper memory mat 500, the chalcogen layer 508 that functions as the nonlinear element NO is disposed on the cathode $E_C$ side with respect to the chalcogen layer 505, which functions as the variable resistance element VR. Additionally, the coefficient of thermal conductivity of the barrier conducting layer 506_5, which is disposed on the surface on the cathode $E_C$ side of the chalcogen layer 505, is smaller than the coefficient of thermal conductivity of the barrier conducting layer 504_5, which is disposed on the surface on the anode $E_A$ side of the chalcogen layer 505.

The configuration allows reducing transmission of the heat generated in the chalcogen layer 307 and the chalcogen layer 505, which function as the variable resistance elements VR, to the chalcogen layer 304 and the chalcogen layer 508, which function as the nonlinear elements NO. Here, when temperatures of the chalcogen layer 304 and the chalcogen layer 508, which function as the nonlinear elements NO, exceed a predetermined temperature, the nonlinear elements NO possibly enter the low resistance state at an unintended timing. According to the embodiment, the semiconductor memory device that reduces a malfunction of the nonlinear element NO and preferably controls the nonlinear element NO can be achieved.

Sixth Embodiment

Next, a configuration of a semiconductor memory device according to the sixth embodiment will be described with reference to FIGS. 8A and 8B.

Figure 8A:
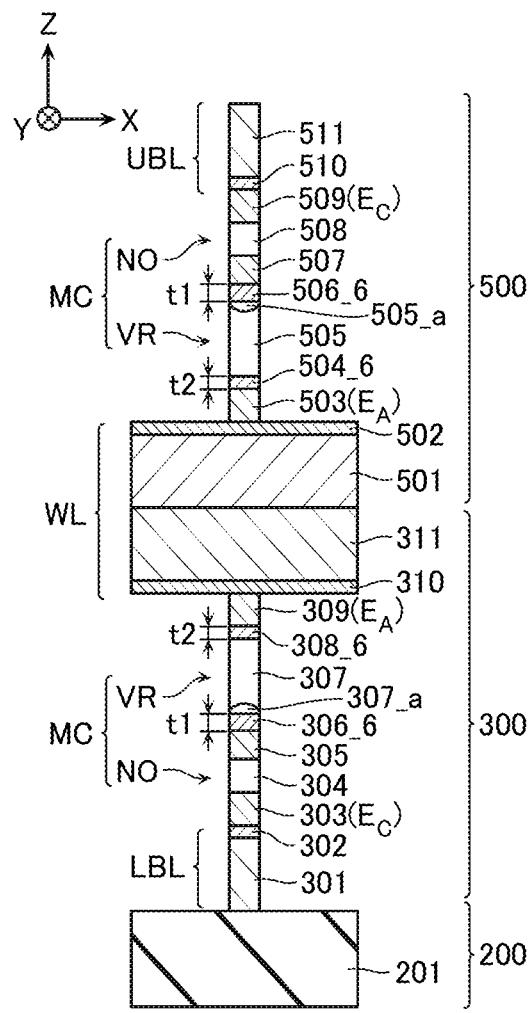
FIGS. 8A and 8B are schematic cross-sectional views illustrating a configuration of a part of a semiconductor memory device according to a sixth embodiment.

FIG. 8A is a schematic cross-sectional view illustrating a cross-sectional surface corresponding to FIG. 7A. FIG. 8B is a schematic cross-sectional view illustrating a cross-sectional surface corresponding to FIG. 7B.

Figure 8B:
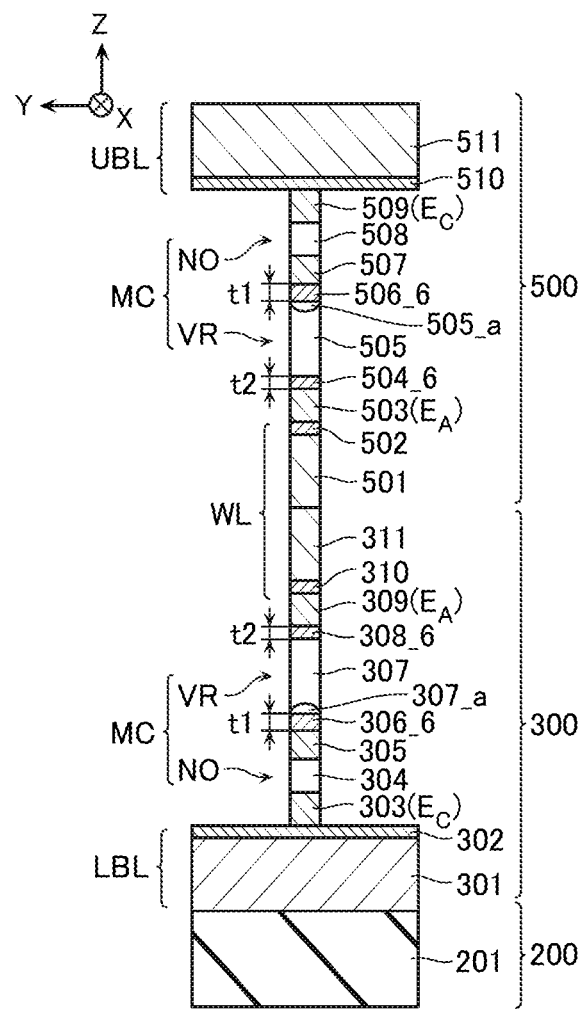

As illustrated in FIGS. 8A and 8B, the memory cell MC according to the embodiment is basically configured similarly to the memory cell MC according to the fifth embodiment (FIGS. 7A and 7B).

However, in the embodiment, similarly to the second embodiment, coefficients of thermal conductivity of barrier conducting layers disposed on top surfaces and lower surfaces of the chalcogen layers 307 and 505 are adjusted by adjusting film thicknesses. That is, the memory cell MC according to the embodiment does not include the barrier conducting layers 306_5, 308_5, 504_5, or 506_5 according to the fifth embodiment but includes barrier conducting layer 306_6, 308_6, 504_6, and 506_6 instead of them. The barrier conducting layers 306_6 and 506_6 are configured similarly to the barrier conducting layers 306_2 and 408_2 and have the film thicknesses t1. The barrier conducting layers 308_6 and 504_6 are configured similarly to the barrier conducting layers 308_2 and 406_2 and have the film thicknesses t2. As described above, the film thickness t1 is larger than the film thickness t2.

In the embodiment, similarly to the fifth embodiment, lower power consumption and a stable switching operation can be achieved. Additionally, in the embodiment, similarly to the fifth embodiment, the nonlinear element NO is preferably controllable.

Seventh Embodiment

Next, a configuration of a semiconductor memory device according to the seventh embodiment will be described with reference to FIGS. 9A and 9B.

FIG. 9A is a schematic cross-sectional view illustrating a cross-sectional surface corresponding to FIG. 7A. FIG. 9B is a schematic cross-sectional view illustrating a cross-sectional surface corresponding to FIG. 7B.

As illustrated in FIGS. 9A and 9B, the memory cell MC according to the embodiment is basically configured similarly to the memory cell MC according to the fifth embodiment (FIGS. 7A and 7B).

However, in the embodiment, similarly to the third embodiment, a polarity of the word line WL and polarities of the lower bit line LBL and the upper bit line UBL are switched.

Therefore, in the embodiment, the electrode layers 303 and 509 function as the anodes $E_A$ of the memory cells MC, and the electrode layers 309 and 503 function as the cathodes $E_C$ of the memory cells MC. Additionally, the phase change region 307_a of the chalcogen layer 307 is disposed in the area on the word line WL side inside the chalcogen layer 307, and the phase change region 505_a of the chalcogen layer 505 is disposed in an area on the word line WL side inside the chalcogen layer 505.

Additionally, the memory cell MC according to the embodiment does not include the barrier conducting layers 306_5, 308_5, 504_5, or 506_5 according to the fifth embodiment, but includes barrier conducting layers 306_7, 308_7, 504_7, and 506_7 instead of them. The barrier conducting layers 308_7 and 504_7 are configured similarly to the barrier conducting layers 306_5 and 506_5. The barrier conducting layers 306_7 and 506_7 are configured similarly to the barrier conducting layers 308_5 and 504_5.

In the embodiment, similarly to the fifth embodiment, lower power consumption and a stable switching operation can be achieved.

Eighth Embodiment

Next, a configuration of a semiconductor memory device according to the eighth embodiment will be described with reference to FIGS. 10A and 10B.

Figure 10A:
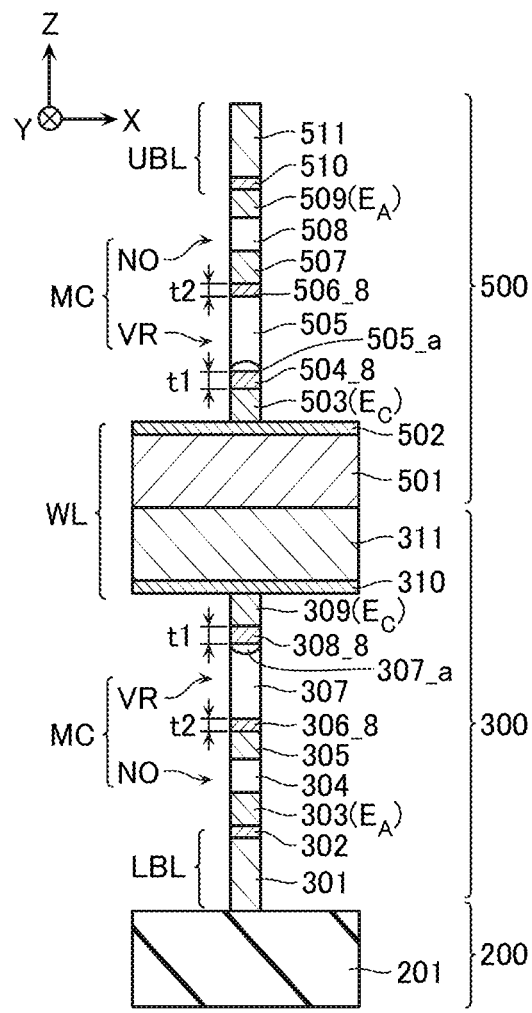
FIGS. 10A and 10B are schematic cross-sectional views illustrating a configuration of a part of a semiconductor memory device according to an eighth embodiment.

FIG. 10A is a schematic cross-sectional view illustrating a cross-sectional surface corresponding to FIG. 9A. FIG. 10B is a schematic cross-sectional view illustrating a cross-sectional surface corresponding to FIG. 9B.

Figure 10B:
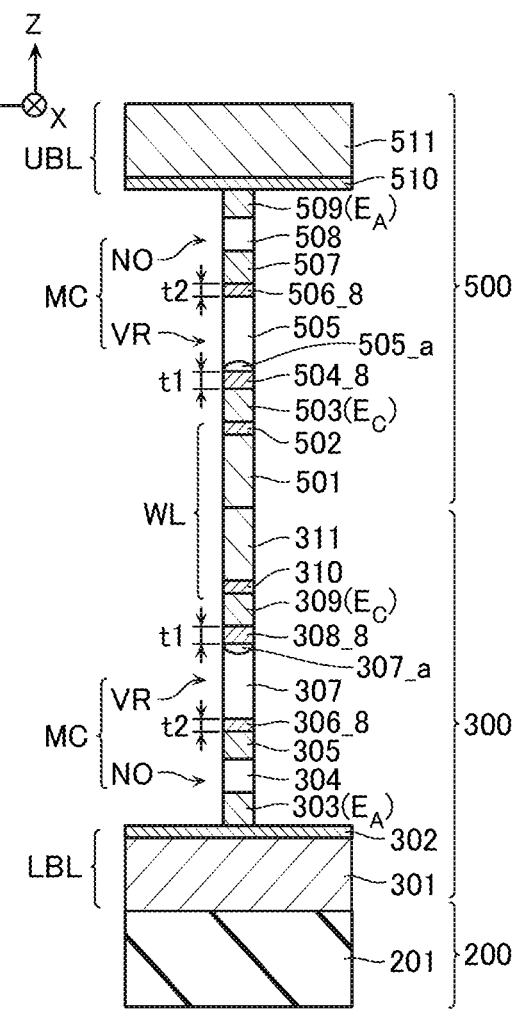

As illustrated in FIGS. 10A and 10B, the memory cell MC according to the embodiment is basically configured similarly to the memory cell MC according to the seventh embodiment (FIGS. 9A and 9B).

However, in the embodiment, similarly to the sixth embodiment, coefficients of thermal conductivity of barrier conducting layers disposed on top surfaces and lower surfaces of the chalcogen layers 307 and 505 are adjusted by adjusting film thicknesses. That is, the memory cell MC according to the embodiment does not include the barrier conducting layers 306_7, 308_7, 504_7, or 506_7 according to the seventh embodiment but includes barrier conducting layers 306_8, 308_8, 504_8, and 506_8 instead of them. The barrier conducting layers 308_8 and 504_8 are configured similarly to the barrier conducting layers 306_2 and 408_2 and have the film thicknesses t1. The barrier conducting layers 306_8 and 506_8 are configured similarly to the barrier conducting layers 308_2 and 406_2 and have the film thicknesses t2. As described above, the film thickness t1 is larger than the film thickness t2.

In the embodiment, similarly to the seventh embodiment, lower power consumption and a stable switching operation can be achieved.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:
1. A semiconductor memory device comprising:
   a first wiring and a second wiring that are arranged in a first direction and extend in a second direction intersecting with the first direction;
   a third wiring that is disposed between the first wiring and the second wiring and extends in a third direction, the third direction intersecting with the first direction and the second direction;
   a first phase change layer disposed between the first wiring and the third wiring;
   a first conducting layer disposed on a surface on a first wiring side of the first phase change layer;
   a second conducting layer disposed on a surface on a third wiring side of the first phase change layer;
   a second phase change layer disposed between the third wiring and the second wiring;
   a third conducting layer disposed on a surface on the third wiring side of the second phase change layer; and
   a fourth conducting layer disposed on a surface on a second wiring side of the second phase change layer, wherein
   the first conducting layer and the fourth conducting layer have coefficients of thermal conductivity larger than coefficients of thermal conductivity of the second conducting layer and the third conducting layer or smaller than the coefficients of thermal conductivity of the second conducting layer and the third conducting layer,
   wherein the first conducting layer and the fourth conducting layer or the second conducting layer and the third conducting layer include a plurality of first films and a plurality of second films, and the plurality of first films and the plurality of second films are arranged in the first direction in alternation and have different coefficients of thermal conductivity.

2. The semiconductor memory device according to claim 1, comprising:
   a first nonlinear element layer disposed between the first wiring and the first conducting layer; and
   a second nonlinear element layer disposed between the third wiring and the third conducting layer.

3. The semiconductor memory device according to claim 1, comprising:
   a third nonlinear element layer disposed between the first wiring and the first conducting layer; and
   a fourth nonlinear element layer disposed between the second wiring and the fourth conducting layer.

4. The semiconductor memory device according to claim 1, comprising:
   a fifth nonlinear element layer disposed between the third wiring and the second conducting layer; and
   a sixth nonlinear element layer disposed between the third wiring and the third conducting layer.

5. The semiconductor memory device according to claim 1, wherein
   the coefficients of thermal conductivity of the first conducting layer and the fourth conducting layer are smaller than the coefficients of thermal conductivity of the second conducting layer and the third conducting layer, or thicknesses in the first direction of the first conducting layer and the fourth conducting layer are larger than thicknesses in the first direction of the second conducting layer and the third conducting layer, and
   at least one of voltages of the first wiring and the second wiring becomes smaller than a voltage of the third wiring in a write operation.

6. The semiconductor memory device according to claim 1, wherein
   the coefficients of thermal conductivity of the first conducting layer and the fourth conducting layer are larger than the coefficients of thermal conductivity of the second conducting layer and the third conducting layer, or thicknesses in the first direction of the first conducting layer and the fourth conducting layer are smaller than thicknesses in the first direction of the second conducting layer and the third conducting layer, and at least one of voltages of the first wiring and the second wiring becomes larger than a voltage of the third wiring in a write operation.

7. A semiconductor memory device comprising:

a first wiring and a second wiring that are arranged in a first direction and extend in a second direction intersecting with the first direction;

a third wiring that is disposed between the first wiring and the second wiring and extends in a third direction, the third direction intersecting with the first direction and the second direction;

a first phase change layer disposed between the first wiring and the third wiring;

a first conducting layer disposed on a surface on a first wiring side of the first phase change layer;

a second conducting layer disposed on a surface on a third wiring side of the first phase change layer;

a second phase change layer disposed between the third wiring and the second wiring;

a third conducting layer disposed on a surface on the third wiring side of the second phase change layer; and a fourth conducting layer disposed on a surface on a second wiring side of the second phase change layer, wherein in the first direction, thicknesses of the first conducting layer and the fourth conducting layer are larger than thicknesses of the second conducting layer and the third conducting layer, or smaller than the thicknesses of the second conducting layer and the third conducting layer, wherein the first conducting layer and the fourth conducting layer or the second conducting layer and the third conducting layer include a plurality of first films and a plurality of second films, and the plurality of first films and the plurality of second films are arranged in the first direction in alternation and have different coefficients of thermal conductivity.

8. The semiconductor memory device according to claim 7, comprising:

a first nonlinear element layer disposed between the first wiring and the first conducting layer; and a second nonlinear element layer disposed between the third wiring and the third conducting layer.

9. The semiconductor memory device according to claim 7, comprising:

a third nonlinear element layer disposed between the first wiring and the first conducting layer; and a fourth nonlinear element layer disposed between the second wiring and the fourth conducting layer.

10. The semiconductor memory device according to claim 7, comprising:

a fifth nonlinear element layer disposed between the third wiring and the second conducting layer; and a sixth nonlinear element layer disposed between the third wiring and the third conducting layer.

11. The semiconductor memory device according to claim 7, wherein coefficients of thermal conductivity of the first conducting layer and the fourth conducting layer are smaller than coefficients of thermal conductivity of the second conducting layer and the third conducting layer, or the thicknesses in the first direction of the first conducting layer and the fourth conducting layer are larger than the thicknesses in the first direction of the second conducting layer and the third conducting layer, and at least one of voltages of the first wiring and the second wiring becomes smaller than a voltage of the third wiring in a write operation.

12. The semiconductor memory device according to claim 7, wherein coefficients of thermal conductivity of the first conducting layer and the fourth conducting layer are larger than coefficients of thermal conductivity of the second conducting layer and the third conducting layer, or the thicknesses in the first direction of the first conducting layer and the fourth conducting layer are smaller than the thicknesses in the first direction of the second conducting layer and the third conducting layer, and at least one of voltages of the first wiring and the second wiring becomes larger than a voltage of the third wiring in a write operation.

13. A semiconductor memory device comprising:

a first wiring and a second wiring that are arranged in a first direction and extend in a second direction intersecting with the first direction;

a third wiring that is disposed between the first wiring and the second wiring and extends in a third direction, the third direction intersecting with the first direction and the second direction;

a first phase change layer disposed between the first wiring and the third wiring;

a first conducting layer disposed on a surface on a first wiring side of the first phase change layer;

a second conducting layer disposed on a surface on a third wiring side of the first phase change layer;

a second phase change layer disposed between the third wiring and the second wiring;

a third conducting layer disposed on a surface on the third wiring side of the second phase change layer; and a fourth conducting layer disposed on a surface on a second wiring side of the second phase change layer, wherein when:

thicknesses in the first direction of the first conducting layer and the fourth conducting layer are denoted as t1;

thicknesses in the first direction of the second conducting layer and the third conducting layer are denoted as t2;

coefficients of thermal conductivity of the first conducting layer and the fourth conducting layer are denoted as $\lambda 1$; and coefficients of thermal conductivity of the second conducting layer and the third conducting layer are denoted as $\lambda 2$;

$((1/\lambda 1) \times t1)/((1/\lambda 2) \times t2)$ is larger than 1.7 or smaller than 1/1.7, wherein the first conducting layer and the fourth conducting layer or the second conducting layer and the third conducting layer include a plurality of first films and a plurality of second films, and the plurality of first films and the plurality of second films are arranged in the first direction in alternation and have different coefficients of thermal conductivity.

14. The semiconductor memory device according to claim 13, comprising:

a first nonlinear element layer disposed between the first wiring and the first conducting layer; and a second nonlinear element layer disposed between the third wiring and the third conducting layer.

15. The semiconductor memory device according to claim 13, comprising:
- a third nonlinear element layer disposed between the first wiring and the first conducting layer; and
- a fourth nonlinear element layer disposed between the second wiring and the fourth conducting layer.

16. The semiconductor memory device according to claim 13, comprising:
- a fifth nonlinear element layer disposed between the third wiring and the second conducting layer; and
- a sixth nonlinear element layer disposed between the third wiring and the third conducting layer.

17. The semiconductor memory device according to claim 13, wherein
- the coefficients of thermal conductivity of the first conducting layer and the fourth conducting layer are smaller than the coefficients of thermal conductivity of the second conducting layer and the third conducting layer, or the thicknesses in first direction of the first conducting layer and the fourth conducting layer are larger than the thicknesses in the first direction of the second conducting layer and the third conducting layer, and
- at least one of voltages of the first wiring and the second wiring becomes smaller than a voltage of the third wiring in a write operation.

18. The semiconductor memory device according to claim 13, wherein
- the coefficients of thermal conductivity of the first conducting layer and the fourth conducting layer are larger than the coefficients of thermal conductivity of the second conducting layer and the third conducting layer, or the thicknesses in the first direction of the first conducting layer and the fourth conducting layer are smaller than the thicknesses in the first direction of the second conducting layer and the third conducting layer, and
- at least one of voltages of the first wiring and the second wiring becomes larger than a voltage of the third wiring in a write operation.

* * * * *